United States Patent
Aasheim et al.

(10) Patent No.: US 6,621,746 B1
(45) Date of Patent: Sep. 16, 2003

(54) MONITORING ENTROPIC CONDITIONS OF A FLASH MEMORY DEVICE AS AN INDICATOR FOR INVOKING ERASURE OPERATIONS

(75) Inventors: Jered Donald Aasheim, Bellevue, WA (US); Yongqi Yang, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 10/087,097

(22) Filed: Feb. 27, 2002

(51) Int. Cl.$^7$ ................................................. G11C 7/00
(52) U.S. Cl. .......................... 365/185.29; 365/185.33; 365/218; 711/103
(58) Field of Search ...................... 365/185.29, 185.33, 365/218, 230.03; 711/103

(56) References Cited

U.S. PATENT DOCUMENTS

| | | | |
|---|---|---|---|
| 5,530,828 A | * | 6/1996 | Kaki et al. ................... 711/103 |
| 5,598,370 A | * | 1/1997 | Niijima et al. .......... 365/185.33 |
| 5,734,816 A | * | 3/1998 | Niijima et al. .................. 714/8 |
| 5,745,418 A | | 4/1998 | Ma et al. |
| 5,867,641 A | | 2/1999 | Jenett |
| 5,887,198 A | | 3/1999 | Houlberg et al. |
| 5,937,425 A | | 8/1999 | Ban |
| 5,956,473 A | | 9/1999 | Ma et al. |
| 6,014,724 A | | 1/2000 | Jenett |
| 6,279,069 B1 | | 8/2001 | Robinson et al. |
| 6,347,051 B2 | * | 2/2002 | Yamagami et al. .... 365/185.09 |

* cited by examiner

Primary Examiner—Son T. Dinh
(74) Attorney, Agent, or Firm—Lee & Hayes, PLLC

(57) ABSTRACT

Erase operations are performed on a flash memory device by monitoring the entropic nature of the flash memory device. In one implementation, flash abstraction logic, tracks how many physical sectors are free to receive data; track how many physical sectors contain data that is dirty, and compare whether the physical sectors that are free to receive data outnumber the physical sectors that contain data that is dirty. A compactor performs an erase operation of one or more blocks when the physical sectors that contain data that is dirty outnumber the physical sectors that are free to receive data. In another implementation, the flash abstraction logic tracks how many physical sector addresses are free to receive data, and track when the physical sector addresses that are free to receive data are insufficient in quantity to receive write requests from a file system. The compactor executes an erase operation of one or more blocks if the physical sector addresses that are free to receive data are insufficient in quantity.

26 Claims, 15 Drawing Sheets

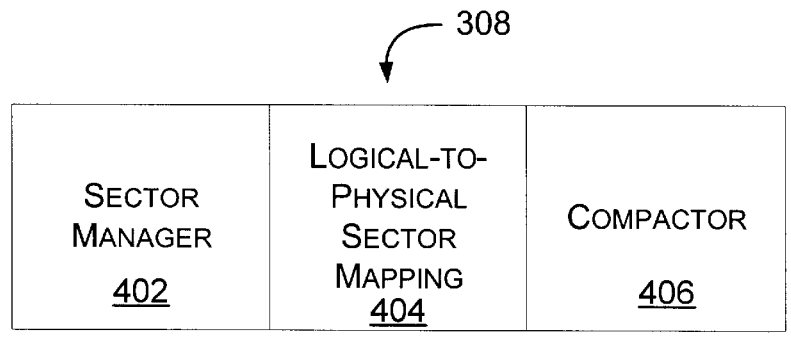
Fig. 4
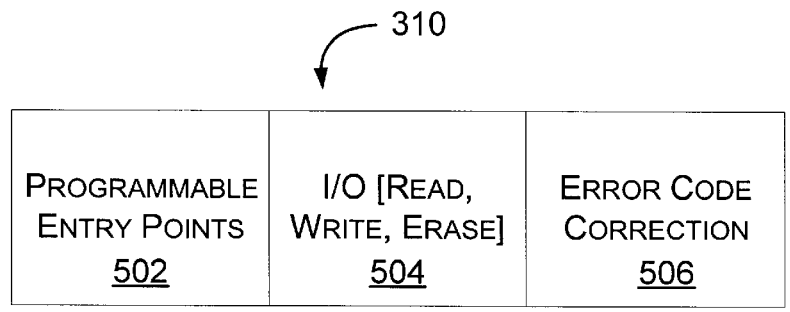
Fig. 5
Fig. 6A
Fig. 6B

MONITORING ENTROPIC CONDITIONS OF A FLASH MEMORY DEVICE AS AN INDICATOR FOR INVOKING ERASURE OPERATIONS

TECHNICAL FIELD

This invention relates to flash memory devices, and more particularly, monitoring when to perform an erase operation in a flash memory device.

BACKGROUND

Flash memory devices have many advantages for a large number of applications. These advantages include their non-volatility, speed, ease of erasure and reprogramming, small physical size and related factors. There are no mechanical moving parts and as a result such systems are not subject to failures of the type most often encountered with hard disk storage systems.

Flash memory devices have many characteristics that are different from other memory devices. One major difference is that a block containing existing data in flash memory devices cannot be overwritten with new data. Existing data must be completely erased (also referred to as "cleaned") from a block before data can be written into memory locations again. Blocks can only be erased a limited number of times before the flash memory device becomes unusable.

Additionally, most block erasures stalls other operations from occurring such as read and write operations to the flash memory device. Most flash memory systems attempt, therefore, to minimize erasures to specific times, such as at initialization or powering-off of a computer system; or at periodically scheduled times.

The problem with periodic scheduled erasure times is that they may occur more often than actually needed which in turn will prematurely shorten the life of a flash memory device.

The problem with scheduling erasures at initialization or powering off of a device is that they may also occur more often than needed which in turn will prematurely shorten the life of a flash memory device. They may also not occur enough in which case the flash memory device may be become full and not accept new data.

SUMMARY

A system and method invokes an erase operation in a flash memory device by monitoring the entropic nature of the flash memory device. In one implementation, flash abstraction logic, tracks how many physical sectors are free to receive data; track how many physical sectors contain data that is dirty, and compare whether the physical sectors that are free to receive data outnumber the physical sectors that contain data that is dirty. A compactor performs an erase operation of one or more blocks when the physical sectors that contain data that is dirty outnumber the physical sectors that are free to receive data.

In another implementation, the flash abstraction logic tracks how many physical sector addresses are free to receive data, and track when the physical sector addresses that are free to receive data are insufficient in quantity to receive write requests from a file system. The compactor executes an erase operation of one or more blocks if the physical sector addresses that are free to receive data are insufficient in quantity.

BRIEF DESCRIPTION OF THE DRAWINGS

The detailed description is described with reference to the accompanying figures. In the figures, the left-most digit(s) of a reference number identifies the figure in which the reference number first appears.

FIG. 4 illustrates a block diagram of flash abstraction logic.

FIG. 5 illustrates an exemplary block diagram of a flash medium logic.

FIG. 6A shows a data structure used to store a corresponding relationship between logical sector addresses and physical sector addresses.

FIG. 6B shows a data structure which is the same as the data structure in FIG. 6B, except its contents have been updated.

DETAILED DESCRIPTION

The following discussion is directed to flash drivers. The subject matter is described with specificity to meet statutory requirements. However, the description itself is not intended to limit the scope of this patent. Rather, the inventors have contemplated that the claimed subject matter might also be embodied in other ways, to include different elements or combinations of elements similar to the ones described in this document, in conjunction with other present or future technologies.

Overview

This discussion assumes that the reader is familiar with basic operating principles of flash memory media.

Nevertheless, a general introduction to two common types of nonvolatile random access memory, NAND and NOR Flash memory media, is provided to better understand the exemplary implementations described herein. These two example flash memory media were selected for their current popularity, but their description is not intended to limit the described implementations to these types of flash media. Other electrically erasable and programmable read-only memories (EEPROMs) would work too. In most examples used throughout this Detailed Description numbers shown in data structures are in decimal format for illustrative purposes.

Universal Flash Medium Operating Characteristics

Figure 1:
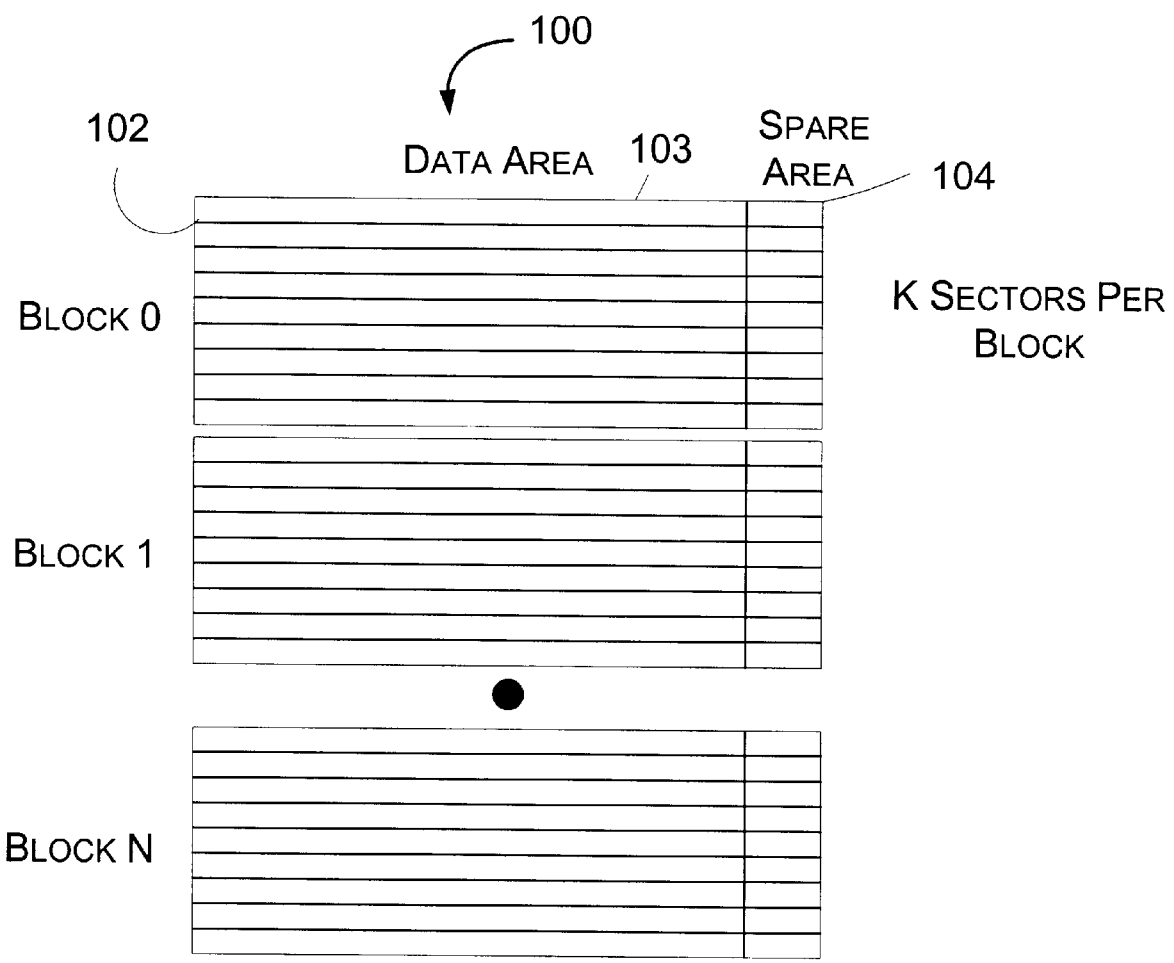
FIG. 1 illustrates a logical representation of a NAND flash memory medium.
Figure 2:
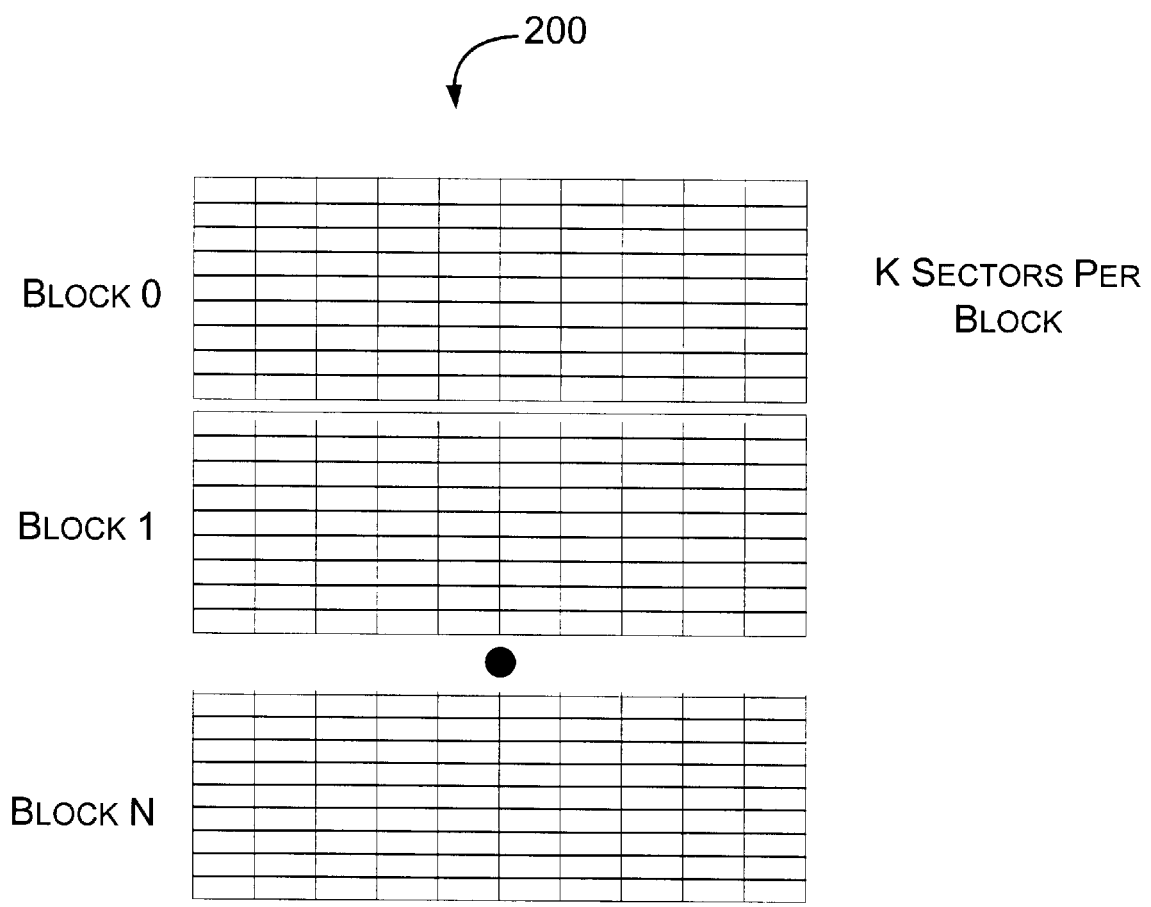
FIG. 2 illustrates a logical representation of a NOR flash memory medium.

FIG. 1 and FIG. 2 illustrate logical representations of example NAND and NOR flash memory media 100, 200, respectively. Both media have universal operating characteristics that are common to each, respectively, regardless of the manufacturer. For example referring to FIG. 1, a NAND flash memory medium is generally split into contiguous blocks (0, 1, through N). Each block 0, 1, 2, etc. is further subdivided into K sectors 102; standard commercial NAND flash media commonly contain 8, 16, or 32 sectors per block. The amount of blocks and sectors can vary, however, depending on the manufacturer. Some manufacturers refer to "sectors" as "pages." Both terms as used herein are equivalent and interchangeable.

Each sector 102 is further divided into two distinct sections, a data area 103 used to store information and a spare area 104 which is used to store extra information such as error correction code (ECC). The data area 103 size is commonly implemented as 512 bytes, but again could be more or less depending on the manufacturer. At 512 bytes, the flash memory medium allows most file systems to treat the medium as a nonvolatile memory device, such as a fixed disk (hard drive). As used herein RAM refers generally to the random access memory family of memory devices such as DRAM, SRAM, VRAM, VDO, and so forth. Commonly, the size of the area spare 104 is implemented as 16 bytes of extra storage for NAND flash media devices. Again, other sizes, greater or smaller can be selected. In most instances, the spare area 104 is used for error correcting codes, and status information.

A NOR memory medium 200 is different than NAND memory medium in that blocks are not subdivided into physical sectors. Similar to RAM, each byte stored within a block of NOR memory medium is individually addressable. Practically, however, blocks on NOR memory medium can logically be subdivided into physical sectors with the accompanying spare area.

Aside from the overall layout and operational comparisons, some universal electrical characteristics (also referred to herein as "memory requirements" or "rules") of flash devices can be summarized as follows:

1. Write operations to a sector can change an individual bit from a logical '1' to a logical '0', but not from a logical '0' to logical '1' (except for case No. 2 below);
2. Erasing a block sets all of the bits in the block to a logical '1';
3. It is not generally possible to erase individual sectors/bytes/bits in a block without erasing all sectors/bytes within the same block;
4. Blocks have a limited erase lifetime of between approximately 100,000 to 1,000, 000 cycles;
5. NAND flash memory devices use ECC to safeguard against data corruption due to leakage currents; and
6. Read operations do not count against the write/erase lifetime.

Flash Driver Architecture

Figure 3:
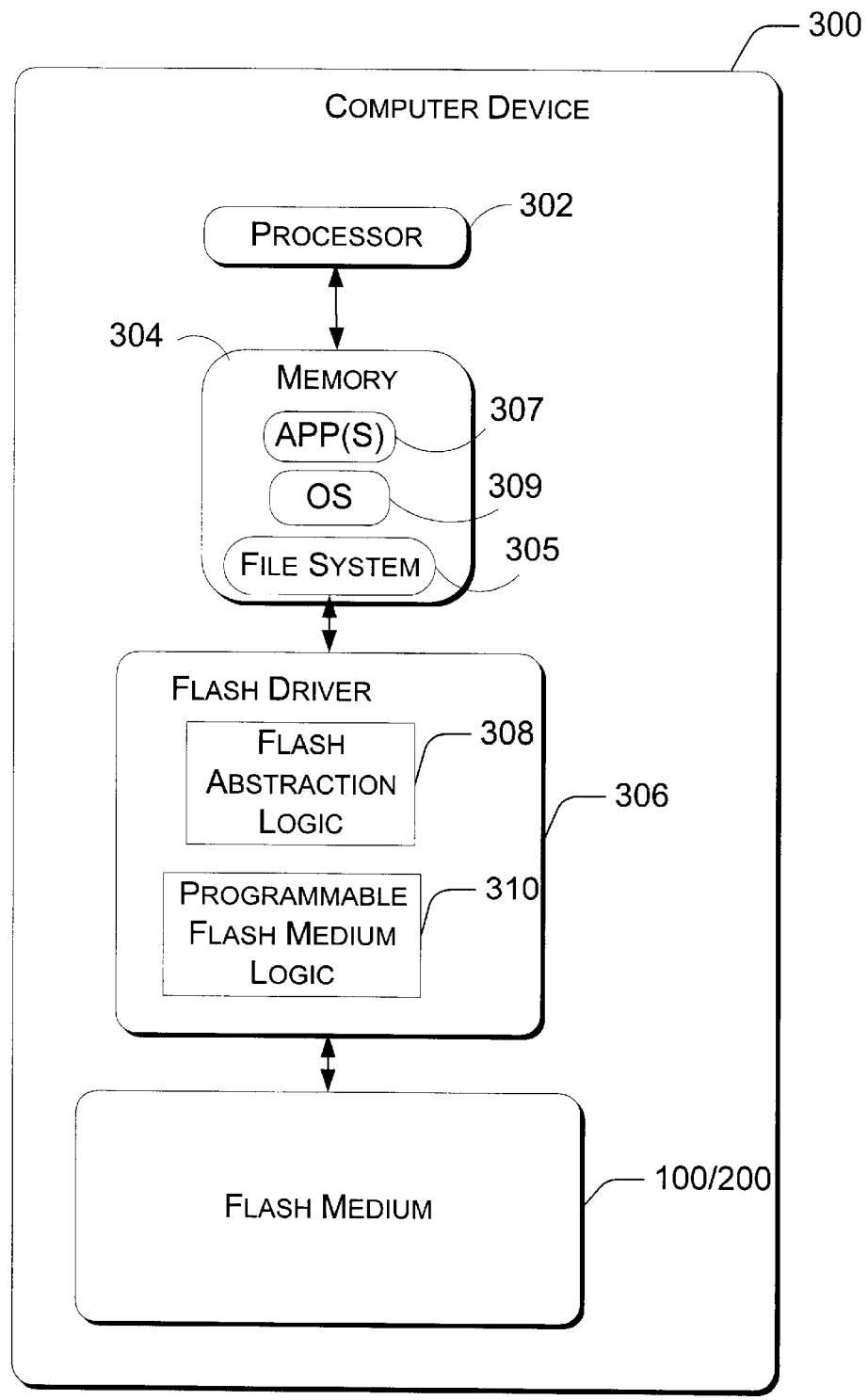
FIG. 3 illustrates pertinent components of a computer device, which uses one or more flash memory devices to store information.

FIG. 3 illustrates pertinent components of a computer device 300, which uses one or more flash memory devices to store information. Generally, various different general purpose or special purpose computing system configurations can be used for computer device 300, including but not limited to personal computers, server computers, hand-held or laptop devices, portable communication devices, multi-processor systems, microprocessor systems, microprocessor-based systems, programmable consumer electronics, gaming systems, multimedia systems, the combination of any of the above example devices and/or systems, and the like.

Computer device 300 generally includes a processor 302, memory 304, and a flash memory media 100/200. The computer device 300 can include more than one of any of the aforementioned elements. Other elements such as power supplies, keyboards, touch pads, I/O interfaces, displays, LEDs, audio generators, vibrating devices, and so forth are not shown, but could easily be a part of the exemplary computer device 300.

Memory 304 generally includes both volatile memory (e.g., RAM) and non-volatile memory (e.g., ROM, PCMCIA cards, etc.). In most implementations described below, memory 304 is used as part of computer device's 302 cache, permitting application data to be accessed quickly without having to permanently store data on a non-volatile memory such as flash medium 100/200.

An operating system 309 is resident in the memory 304 and executes on the processor 302. An example operating system implementation includes the Windows® CE operating system from Microsoft Corporation, but other operation systems can be selected from one of many operating systems, such as DOS, UNIX, etc. For purposes of illustration, programs and other executable program components such as the operating system are illustrated herein as discrete blocks, although it is recognized that such programs and components reside at various times in different storage components of the computer, and are executed by the processor(s) of the computer device 300.

One or more application programs 307 are loaded into memory 304 and run on the operating system 309. Examples of applications include, but are not limited to, email programs, word processing programs, spreadsheets programs, Internet browser programs, as so forth.

Also loaded into memory 304 is a file system 305 that also runs on the operating system 309. The file system 305 is generally responsible for managing the storage and retrieval of data to memory devices, such as magnetic hard drives, and this exemplary implementation flash memory media 100/200. Most file systems 305 access and store information at a logical level in accordance with the conventions of the operating system the file system 305 is running. It is possible for the file system 305 to be part of the operating system 309 or embedded as code as a separate logical module.

Flash driver 306 is implemented to function as a direct interface between the file system 305 and flash medium 100/200. Flash driver 306 enables computer device 300 through the file system 305 to control flash medium 100/200 and ultimately send/retrieve data. As shall be described in more detail, however, flash driver 306 is responsible for more than read/write operations. Flash driver 306 is implemented to maintain data integrity, perform wear-leveling of the flash medium, minimize data loss during a power interruption to computer device 300 and permit OEMs of computer devices 300 to support their respective flash memory devices regardless of the manufacturer. The flash driver 306 is file system agnostic. That means that the flash driver 306 supports many different types of files systems, such as File Allocation Data structure File System (FAT16), (FAT32), and other file systems. Additionally, flash driver 306 is flash memory medium agnostic, which likewise means driver 306 supports flash memory devices regardless of the manufacturer of the flash memory device. That is, the flash driver 306 has the ability to read/write/erase data on a flash medium and can support most, if not all, flash devices.

In the exemplary implementation, flash driver 306 resides as a component within operating system 309, that when executed serves as a logical interface module between the file system 305 and flash medium 100/200. The flash driver 306 is illustrated as a separate box 306 for purposes of demonstrating that the flash driver when implemented serves as an interface. Nevertheless, flash driver 306 can reside in other applications, part of the file system 305 or independently as separate code on a computer-readable medium that executes in conjunction with a hardware/firmware device.

In one implementation, flash driver 306 includes: a flash abstraction logic 308 and a programmable flash medium logic 310. Flash abstraction logic 308 and programmable medium logic 310 are coded instructions that support various features performed by the flash driver 306. Although the exemplary implementation is shown to include these two elements, various features from each of the flash abstraction logic 308 and flash medium logic 310 may be selected to carry out some of the more specific implementations described below. So while the described implementation shows two distinct layers of logic 308/310, many of the techniques described below can be implemented without necessarily requiring all or a portion of the features from either layer of logic. Furthermore, the techniques may be implemented without having the exact division of responsibilities as described below.

In one implementation, the Flash abstraction logic 308 manages those operating characteristics that are universally common to flash memory media. These universal memory requirements include wear-leveling, maintaining data integrity, and handling recovery of data after a power failure. Additionally, the flash abstraction logic 308 is responsible for mapping information stored at a physical sector domain on the flash memory medium 100/200 to a logical sector domain associated with the file system 305. That is, the flash abstraction logic 308 tracks data going from a logical-to-physical sector addresses and/or from a physical-to-logical sector addresses. Driver 306 uses logical-to-physical sector addresses for both read/write operations. Driver 306 goes from physical-to-logical sector addresses when creating a look-up table (to be described below) during driver initialization. Some of the more specific commands issued by the file system that are dependent upon a certain type of flash memory media are sent directly to the flash medium logic 310 for execution and translation. Thus, the flash abstraction logic 308 serves as a manager to those universal operations, which are common to flash memory media regardless of the manufacturer for the media, such as wear-leveling, maintaining data integrity, handling data recovery after a power failure and so forth.

FIG. 4 illustrates an exemplary block diagram of the flash abstraction logic 308. Flash abstraction logic 308 includes a sector manager 402, a logical-to-physical sector mapping module 404, and a compactor 406. Briefly, the sector manager 402 provides a pointer to a sector available, i.e., "free" to receive new data. The logical-to-physical sector mapping module 404 manages data as it goes from a file system domain of logical sector addressing to a flash medium domain of physical sector addressing. The compactor 406 provides a mechanism for clearing blocks of data (also commonly referred to in the industry as "erasing") to ensure that enough free sectors are available for writing data. Additionally, the compactor 406 helps the driver 306 system perform uniform and even wear leveling. All these elements shall be described in more detail below.

Referring back to FIG. 3, the flash medium logic 310 is used to translate logical commands, received from either the flash abstraction logic 308 or file system 305, to physical sector commands for issuance to the flash memory medium 100/200. For instance, the flash medium logic 310 reads, writes, and erases data to and/or from the flash memory medium. The flash medium logic 310 is also responsible for performing ECC (if necessary). In one implementation, the flash medium logic 310 is programmable to permit users to match particular flash medium requirements of a specific manufacturer. Thus, the flash medium logic 310 is configured to handle specific nuances, ECC, and specific commands associated with controlling physical aspects of flash medium 100/200.

FIG. 5 illustrates an exemplary block diagram of the flash medium logic 310. As shown, the flash medium logic 310 includes a programmable entry point module 502, I/O module 504 and an ECC module 506. The programmable entry point module 502 defines a set of programming interfaces to communicate between flash abstraction logic 308 and flash medium 100/200. In other words, the programmable entry points permit manufacturers of computer devices 300 to program the flash media logic 310 to interface with the actual flash memory medium 100/200 used in the computer device 300. The I/O module 504 contains specific code necessary for read/write/erase commands that are sent to the Flash memory medium 100/200. The user can program the ECC module 506 to function in accordance with any particular ECC algorithm selected by the user.

Tracking Data

File system 305 uses logical sector addressing to read and store information on flash memory medium 100/200. Logical sector addresses are address locations that the file system reads and writes data to. They are "logical" because they are relative to the file system. In actuality, data may be stored in completely different physical locations on the flash memory medium 100/200. These physical locations are referred to as physical sector addresses.

The flash driver 306 is responsible for linking all logical sector address requests (i.e., read & write) to physical sector address requests. The process of linking logical-to-physical sector addresses is also referred to herein as mapping. Going from logical to physical sector addresses permits flash driver 306 to have maximum flexibility when deciding where to store data on the flash memory medium 100/200. The logical-to-physical sector mapping module 404 permits data to be flexibly assigned to any physical location on the flash memory medium, which provides efficiency for other tasks, such as wear-leveling and recovering from a power failure. It also permits the file system 305 to store data in the fashion it is designed to do so, without needing intelligence to know that the data is actually being stored on a flash medium in a different fashion.

FIG. 6A shows an exemplary implementation of a data structure (i.e., a table) 600A generated by the flash driver 306. The data structure 600A is stored in a volatile portion of memory 304, e.g. RAM. The data structure 600A includes physical sector addresses 602 that have a corresponding logical sector address 604. An exemplary description of how table 600A is generated is described with reference to FIG. 7.

Figure 7:
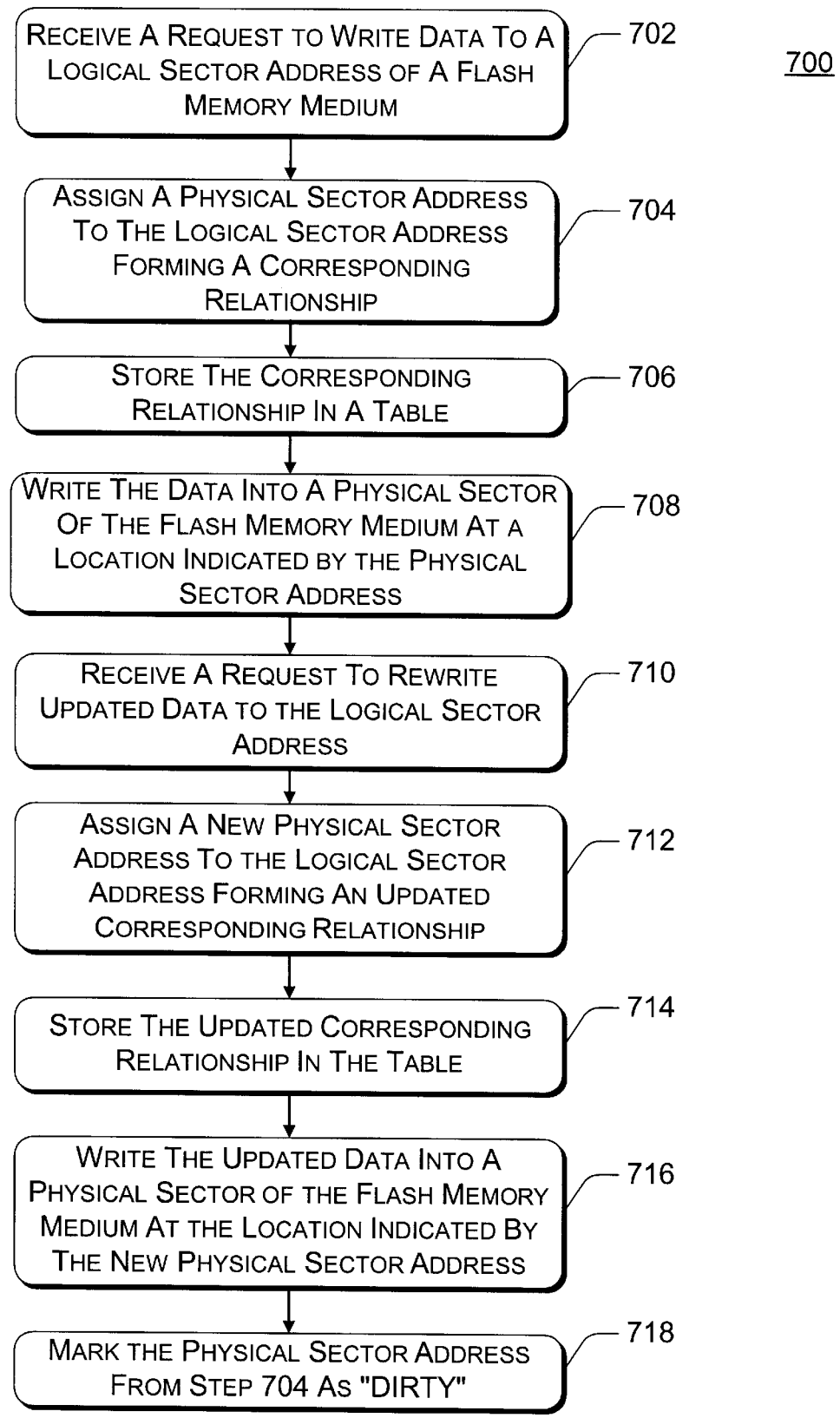
FIG. 7 illustrates a process used to track data on the flash memory medium when the file system issues write requests to the flash driver.

FIG. 7 illustrates a process 700 used to track data on the flash memory medium 100/200 when the file system 305 issues write requests to the flash driver 306. Process 700 includes steps 702–718. Referring to FIGS. 6A and 7, in step 702, flash abstraction logic 308 receives a request to write data to a specified logical sector address 604.

In step 704, the sector manager 402 ascertains a free physical sector address location on the flash medium 100/200 that can accept data associated with the write request (how the sector manager 402 chooses physical sector addresses will be explained in more detail below). A free physical sector is any sector that can accept data without the need to be erased first. Once the sector manager 402 receives the physical sector address associated with a free physical sector location, the logical-to-physical sector mapping module 404 assigns the physical sector address to the logical sector address 604 specified by write request forming a corresponding relationship. For example, a physical sector address of 0 through N can be assigned to any arbitrary logical sector address 0 through N.

Next, in step 706, the logical-to-physical sector mapping module 404 stores the corresponding relationship of the physical sector address to the logical sector address in a data structure, such as the exemplary table 600A in memory 305. As shown in the exemplary data structure 600A, three logical sector addresses 604 are assigned to corresponding physical sector addresses 602.

Next, in step 708 data associated with the logical sector address write request is stored on the flash medium 100/200 at the physical sector address location assigned in step 704. For example, data would be stored in physical sector address location of zero on the medium 100/200, which corresponds to the logical sector address of 11.

Now, in step 710, suppose for example purposes the file system 305 issues another write request, but in this case, to modify data associated with a logical sector address previously issued in step 702. Then, flash driver 306 performs steps 712 through 714, which are identical to steps 704 through 708, respectively, which are described above.

In step 718, however, after the updated data associated with step 710 is successfully stored on the flash medium 100/200, the logical-to-physical sector mapping module 404 marks the old physical sector address assigned in step 704 as "dirty." Old data is marked dirty after new data is written to the medium 100/200, so in the event there is a power failure in the middle of the write operation, the logical-to-physical sector mapping module 404 will not lose old data. It is possible to lose new or updated data from steps 702 or 710, but since there is no need to perform an erase operation only one item of new or modified data is lost in the event of a power failure.

FIG. 6B shows a data structure 600B which is the same as data structure 600A, except its contents have been updated. In this example the file system 305 has updated data associated with logical sector address 11. Accordingly, the flash driver 306 reassigns logical sector address 11 to physical sector address 3 and stores the reassigned corresponding relationship between the these two addresses in data structure 600B. As illustrated in data structure 600B, the contents of logical sector 11 are actually written to physical sector address 3 and the contents of sector 0 are marked "dirty" after the data contents are successfully written into physical sector address 3 as was described with reference to steps 710–718.

This process of reassigning logical-to-physical sector address when previously stored data is updated by the file system 305, permits write operations to take place without having to wait to move an entire block of data and perform an erase operation. So, process 700 permits the data structure to be quickly updated and then the physical write operation can occur on the actual physical medium 100/200. Flash abstraction logic 308 uses the data structures, such as 600A/600B, to correctly maintain logical-to-physical mapping relationships.

When there is a read request issued by the files system 305, the flash abstraction logic 308, through the logical-to-physical mapping module 404, searches the data structure 600A/600B to obtain the physical sector address which has a corresponding relationship with the logical sector address associated with read request. The flash medium logic 310 then uses that physical sector address as a basis to send data associated with the read request back to the file system 305. The file system 305 does not need intelligence to know that its requests to logical sector addresses are actually mapped to physical sector addresses.

Power-Interruption Protection

Write operations are performed at the sector-level as opposed to the block-level, which minimizes the potential for data loss during a power-failure situation. A sector worth of data is the finest level of granularity that is used with respect to most file systems 305. Therefore, if the flash driver 306 is implemented to operate at a per sector basis, the potential for data loss during a power failure is reduced.

As mentioned above, data structures 600A, 600B are stored in memory 304, which in one exemplary implementation is typically a volatile memory device subject to complete erasure in the event of a power failure. To safeguard data integrity on the flash medium 100/200, logical-to-physical mapping information stored in the data structures 600A/600B is backed-up on the flash memory medium.

In one exemplary implementation, to reduce the cost associated with storing the entire data structure on the flash memory medium 100/200, the logical sector address is stored in the spare 104 area of the medium with each physical sector in which the logical sector address has a corresponding relationship.

Figure 8:
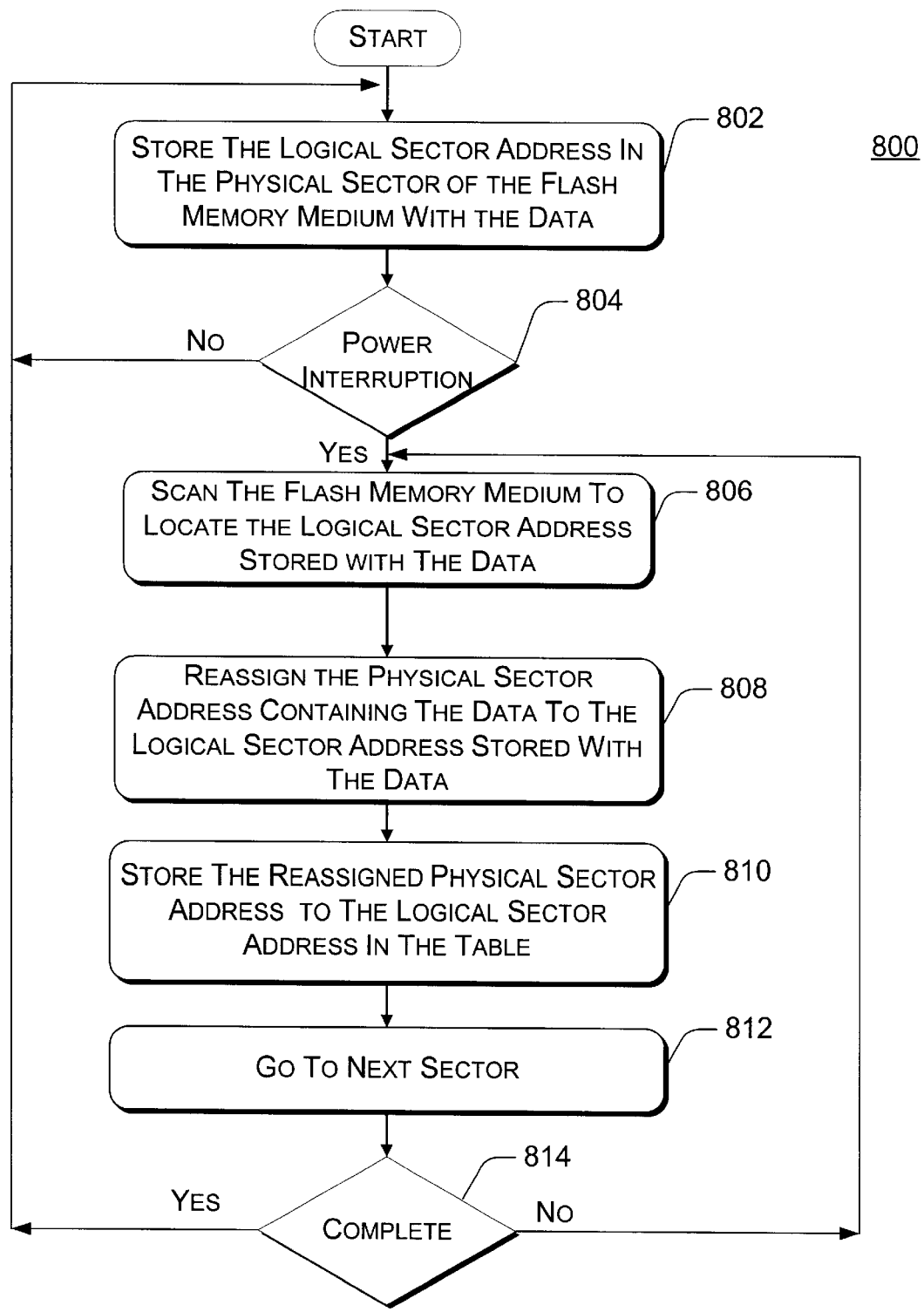
FIG. 8 illustrates a process for safeguarding mapping of logical-to-physical sector address information stored in volatile data structures, such as the data structures shown in FIGS. 6A and 6B.
Figure 9:
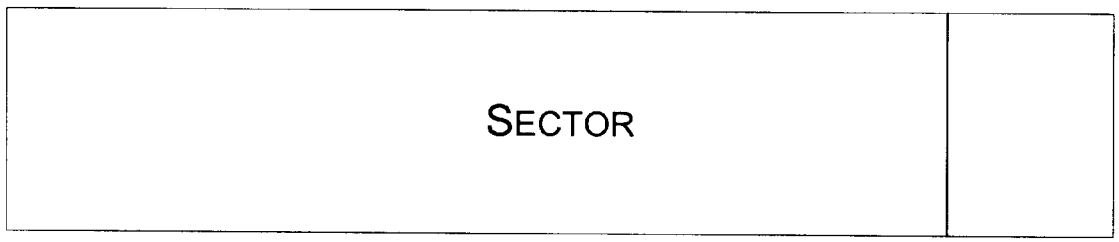
FIG. 9 illustrates a location within the flash memory medium in which the logical sector address can be stored for safeguarding in the event of a power failure.
Figure 9:
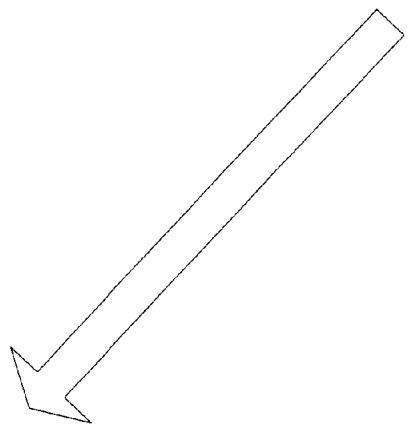

FIG. 8 illustrates a process 800 for safeguarding mapping of logical-to-physical sector address information stored in volatile data structures, such as exemplary data structures 600A and 600B. Process 800 includes steps 802–814. The order in which the process is described is not intended to be construed as a limitation. Furthermore, the process can be implemented in any suitable hardware, software, firmware, or combination thereof. In step 802, the logical sector address associated with the actual data is stored in the physical sector of the flash memory medium 100/200 at the physical sector address assigned to the logical sector address. In the case of a NAND flash memory medium 100, the logical sector address is stored in the spare area 104 of the medium. Using this scheme, the logical-to-physical sector mapping information is stored in a reverse lookup format. Thus, after a power failure situation, it is necessary to scan the spare area for each physical sector on the media, determine the corresponding logical sector address, and then update the in-memory lookup table accordingly. FIG. 9 illustrates a location with in media 100/200 in which the logical sector address can be stored. As previously mentioned, blocks of NOR flash memory can be logically subdivided into physical sectors each with a spare area (similar to NAND). Using this technique, the logical sector address is stored in the spare area for each the physical sector similar to the process used with NAND flash memory (shown in FIG. 15 as space 1504 to be described with reference to FIG. 15).

In the event there is a power interruption and the data structures 600A, 600B are lost, as indicated by the YES branch of decisional step 804 of FIG. 8, then flash abstraction logic 308 uses the flash medium logic 310 to scan the flash memory medium to locate the logical sector address stored with data in each physical address (see FIG. 9), as indicated in step 806. In step 808, the physical sector address in which data is contained is reassigned to the logical sector address located with the data on the medium. As the physical and logical sector address are reestablished they are stored back in the data structures 600A, 600B and the flash medium logic 310 goes to the next sector containing data as indicated in step 812. Steps 806–812 repeat until all sectors containing data have been are scanned and the data structure is reestablished. Normally, this occurs at initialization of the computer device 300.

Accordingly, when a power failure occurs, process 800 enables the flash abstraction logic 308 to scan the medium 100/200 and rebuild the logical-to-physical mapping in a data structure such as the exemplary data structure 600. Process 800 ensures that mapping information is not lost during a power failure and that integrity of the data is retained.

Dynamic Look-up Data Structure for Tracking Data

Figure 10:
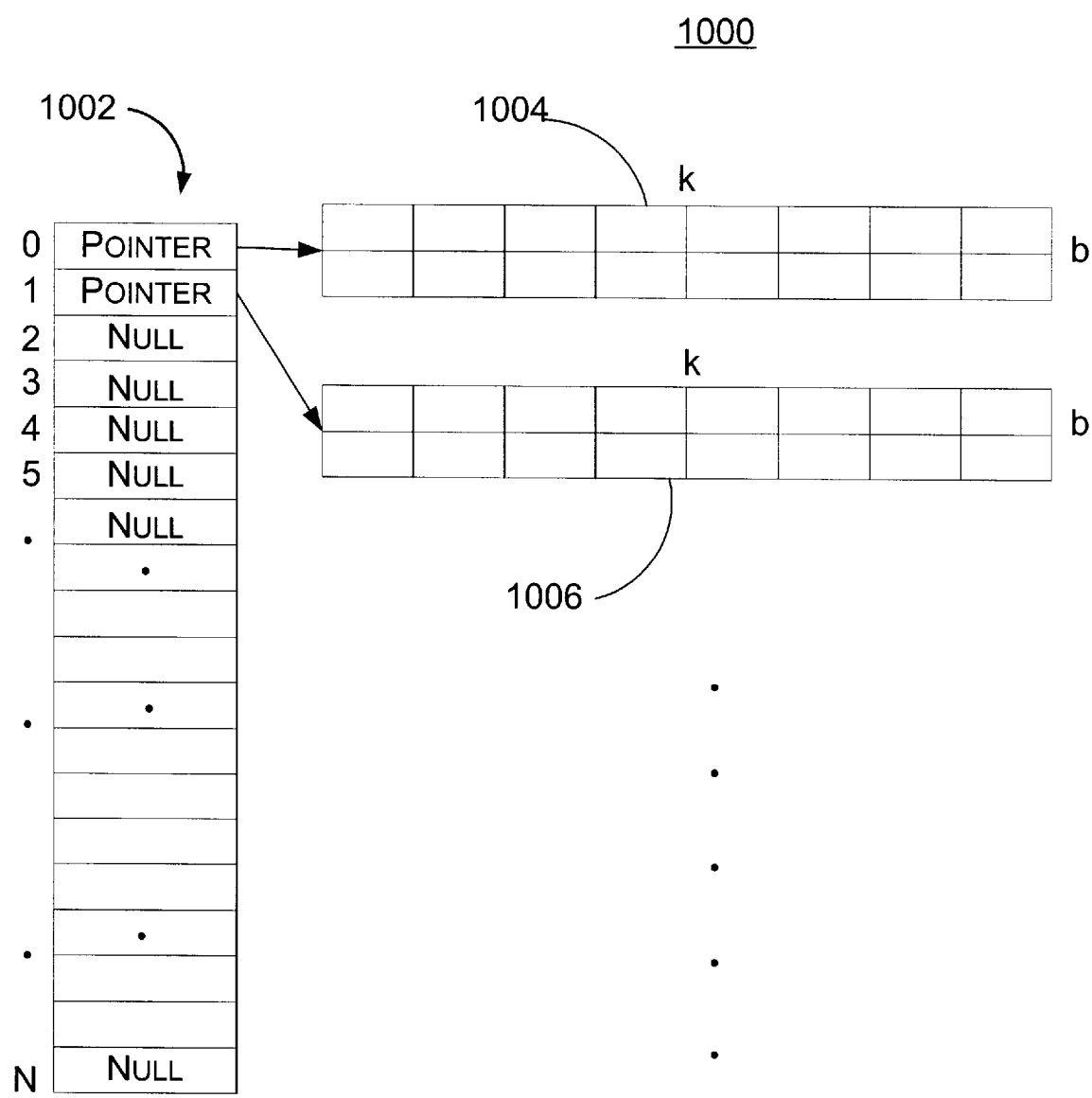
FIG. 10 illustrates a dynamic look-up data structure to track data stored in the flash memory medium.

FIG. 10 illustrates a dynamic look-up data structure 1000 to track data stored in the flash memory medium 100/200. Data structure 1000 includes a master data structure 1002 and one or more secondary data structures 1004, 1006. The data structures are generated and maintained by the flash driver 306. The data structures are stored in a volatile portion of memory 304. The one or more secondary tables 1004, 1006 contain mappings of logical-to-physical sector addresses. Each of the secondary data structures 1004, 1006, as will be explained, have a predetermined capacity of mappings. The master data structure 1002 contains a pointer to each of the one or more secondary data structures 1004, 1006. Each secondary data structure is allocated on as needed basis for mapping those logical-to-physical addresses that are used to store data. Once the capacity of a secondary data structure 1004, 1006, etc., is exceeded, another secondary data structure is allocated, and another, etc., until eventually all possible physical sector addresses on the flash medium 100/200 are mapped to logical sector addresses. Each time a secondary table is allocated, a pointer contained in the master data structure 1002 is enabled by the flash driver 306 to point to it.

Accordingly, the flash driver 306 dynamically allocates one or more secondary data structures 1004, 1006 based on the amount of permanent data stored on the flash medium itself. The size characteristics of the secondary data structures are computed at run-time using the specific attributes of the flash memory medium 100/200. Secondary data structures are not allocated unless the secondary data structure previously allocated is full or insufficient to handle the amount of logical address space required by the file system 305. Dynamic look-up data structure 1000, therefore, minimizes usage of memory 304. Dynamic look-up data structure 1000 lends itself to computer devices 300 that use calendars, inboxes, documents, etc. where most of the logical sector address space will not need to be mapped to a physical sector address. In these applications, only a finite range of logical sectors are repeatedly accessed and new logical sectors are only written when the application requires more storage area.

The master data structure 1002 contains an array of pointers, 0 through N that point to those secondary data structures that are allocated. In the example of FIG. 10, the pointers at location 0 and 1 point to secondary data structures 1004 and 1006, respectively. Also, in the example illustration of FIG. 10, pointers 2 through N do not point to any secondary data structures and would contain a default setting, "NULL", such that the logical-to-physical sector mapping module 404 knows that there are no further secondary data structures allocated.

Each secondary data structure 1004, 1006 is similar to data structures 600, but only a portion of the total possible medium is mapped in the secondary data structures. The secondary data structures permit the flash abstraction logic 308 to reduce the amount space needed in memory 304, to only those portions of logical sectors addresses issued by the file system. Each secondary data structure is (b*k) bytes in size, where k is the number of physical sector addresses contained in the data structure and b is the number of bytes used to store each physical sector address.

Figure 11:
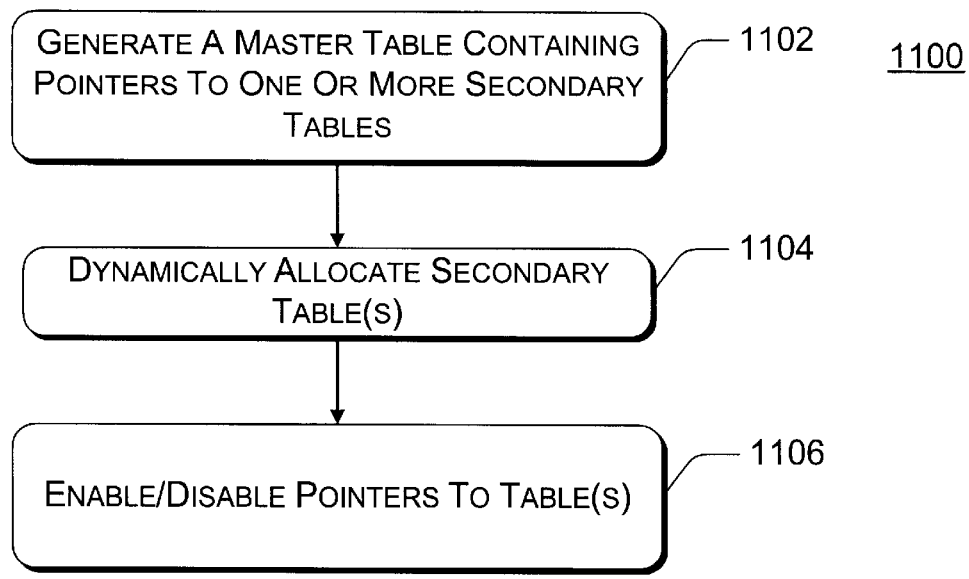
FIG. 11 illustrates a process for dynamically allocating look-up data structures for tracking data on the flash memory medium.

FIG. 11 illustrates a process 1100 for dynamically allocating look-up data structures for tracking data on the flash memory medium 100/200. Process 1100 includes steps 1102 through 1106. The order in which the process is described is not intended to be construed as a limitation. Furthermore, the process can be implemented in any suitable hardware, software, firmware, or combination thereof.

In step 1102, a master data structure 1002 containing the pointers to one or more secondary data structures 1004, 1006 is generated. The master data structure 1002 in this exemplary implementation is fixed in size. At the time the computer device 300 boots-up, the flash medium logic 310 determines the size of the flash memory medium 100/200 and relays this information to the flash abstraction logic 308. Based on the size of the flash medium, the flash abstraction logic 308 calculates a range of physical addresses. That is, suppose the size of the flash medium is 16 MB, then a NAND flash medium 100 will typically contain 32768 sectors each 512 bytes in size. This means that the flash abstraction logic 308 may need to map a total of 0 through 32768 logical sectors in a worse case scenario, assuming all the memory space is used on the flash medium. Knowing that there are $2^{15}$ sectors on the medium, the flash abstraction logic 308 can use 2 bytes to store the physical sector address for each logical sector address. So the master data structure is implemented as an array of 256 DWORDs (N=256), which covers the maximum quantity of logical sector addresses (e.g., 32768) to be issued by the files system. So, there are a total of 256 potential secondary data structures.

In step 1104 the secondary data structure(s) are allocated. First, the flash abstraction logic determines the smallest possible size for each potential secondary data structure. Using simple division, 32768/256=128 logical sector addresses supported by each data structure. As mentioned above, the entire physical space can be mapped using 2 bytes, b=2, therefore, each secondary data structure will by 256 bytes in size or (b=2 * k=128).

Now, knowing the size of each secondary data structure, suppose that the file system 305 requests to write to logical sector addresses 50–79, also known as LS50–LS79. To satisfy the write requests from the files system 305, the flash abstraction logic 308 calculates that the first pointer in master data structure 1002 is used for logical sector addresses LS0–LS127 or data structure 1004. Assuming the first pointer is NULL, the flash abstraction logic 308 allocates data structure 1004 (which is 256 bytes in size) in memory 304. As indicated in step 1106, the flash abstraction logic 308 enables the pointer in position 0 of the master data structure to point to data structure 1004. So, in this example, data structure 1004 is used to store the mapping information for logical sectors LS50–LS79.

The flash abstraction logic 308 allocates a secondary data structure, if the file system 305 writes to the corresponding area in the flash medium 100/200. Typically, only the logical sector addresses that are used are mapped by the flash abstraction logic 308. So, in the worst case scenario, when the file system 305 accesses the entire logical address space, then all 256 secondary data structures (only two, 1004, 1006 are shown to be allocated in the example of FIG. 10), each 256 bytes in size will be allocated requiring a total of 64 KB of space in memory 304.

When an allocated data structure 1004, for instance, becomes insufficient to store the logical sector address space issued by the file system 305, then the flash abstraction logic 308 allocates another data structure, like data structure 1006. This process of dynamically allocating secondary data structures also applies if data structure 1004 becomes sufficient at a later time to again handle all the logical sector address requests made by the file system. In this example, the pointer to data structure 1006 would be disabled by the flash abstraction logic 308; and data structure 1006 would become free space in memory 304.

Uniform Wear Leveling and Recycling of Sectors

Figure 12:
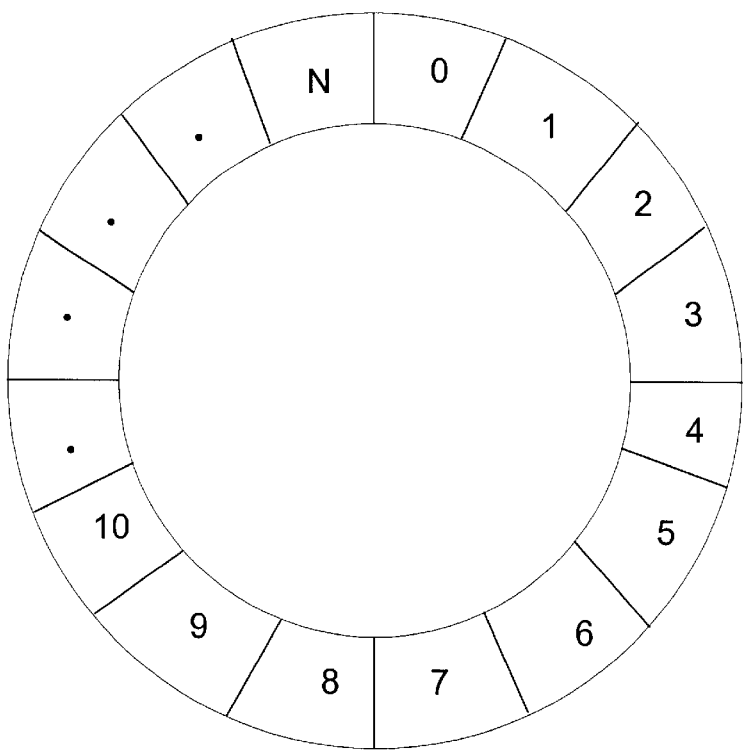
FIG. 12 is a diagram of the flash memory medium viewed and/or treated as a continuous circle by the flash driver.

FIG. 12 is a diagram of flash memory medium 100/200 viewed and/or treated as a continuous circle 1200 by the flash driver 306. Physically the flash memory media is the same as either media 100/200 shown in FIGS. 1 and 2, except the flash abstraction logic 308, organizes the flash memory medium as if it is a continuous circle 1200, containing 0-to-N blocks. Accordingly, the highest physical sector address (individual sectors are not shown in FIG. 12 to simplify the illustration, but may be seen in FIGS. 1 and 2) within block N and the lowest physical sector address within block 0 are viewed as being contiguous.

Figure 13:
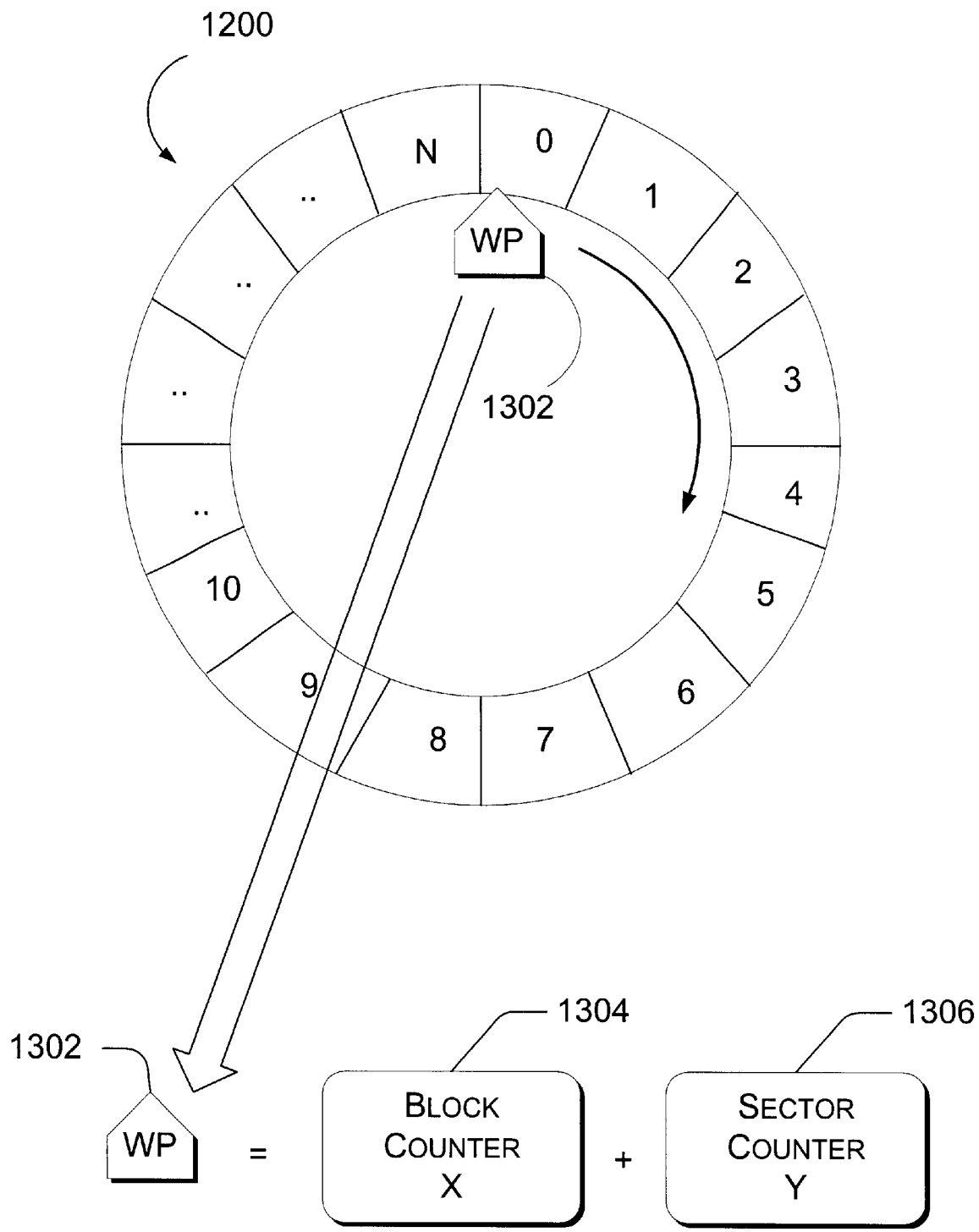
FIG. 13 depicts another illustration of the media viewed as a continuous circle.

FIG. 13 illustrates another view of media 100/200 viewed as a continuous circle 1200. In this exemplary illustration, the sector manager 402 maintains a write pointer 1302, which indicates a next available free sector to receive data on the medium. The next available free sector is a sector that can accept data without the need to be erased first in a prescribed order. The write pointer 1102 is implemented as a combination of two counters: a sector counter 1306 that counts sectors and a block counter 1304 that counts blocks. Both counters combined indicate the next available free sector to receive data.

In an alternative implementation, the write pointer 1302 can be implemented as a single counter and indicate the next physical sector that is free to accept data during a write operation. According to this implementation, the sector manager 402 maintains a list of all physical sector addresses free to receive data on the medium. The sector manager 402 stores the first and last physical sector addresses (the contiguous addresses) on the medium and subtracts the two addresses to determine an entire list of free sectors. The write pointer 1302 then advances through the list in a circular and continuous fashion. This reduces the amount of information needed to be stored by the sector manager 402.

Figure 14:
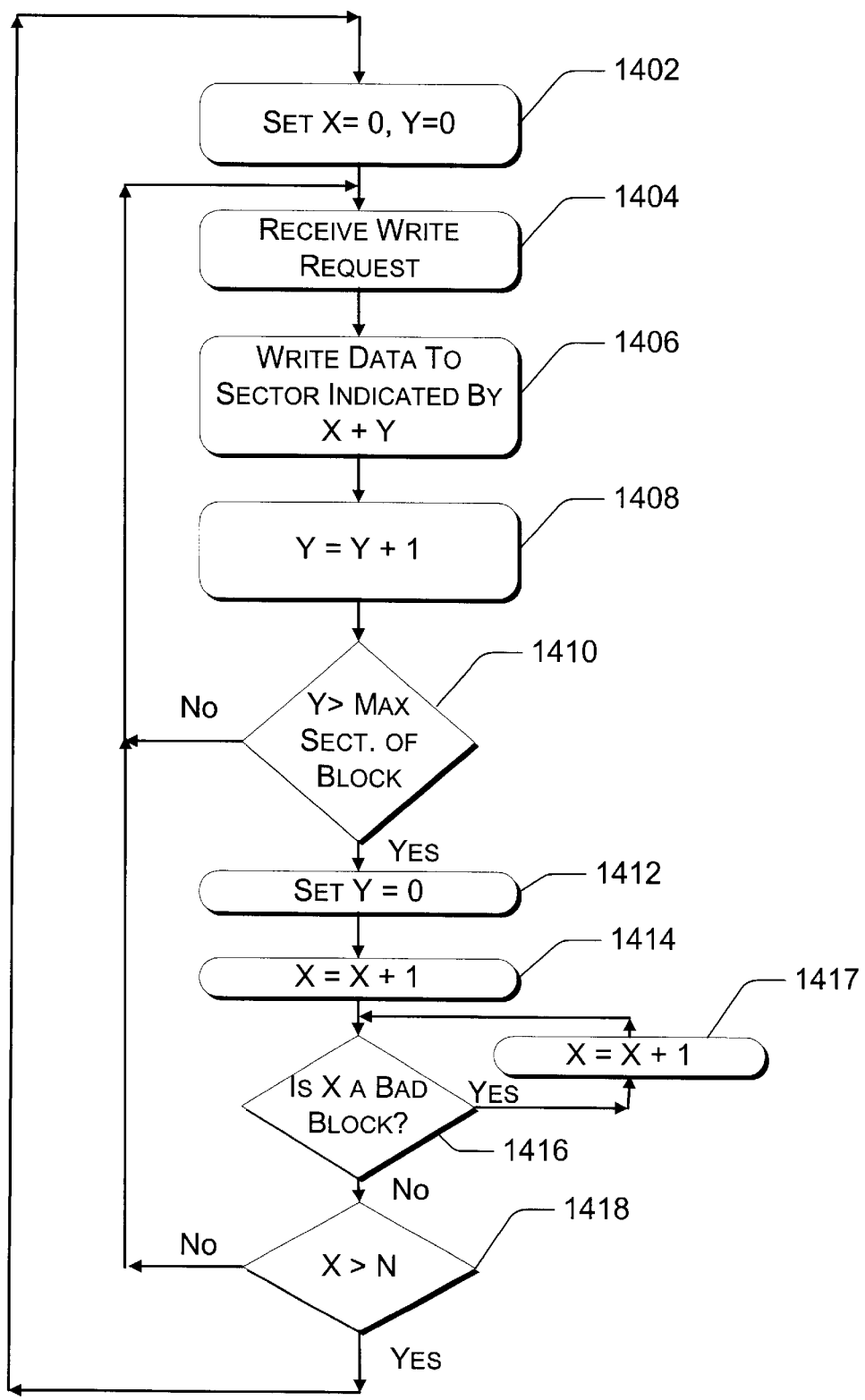
FIG. 14 illustrates a process used by the sector manager to determine the next available free sector location for the flash driver to store data on the medium.

FIG. 14 illustrates a process 1400 used by the sector manager 402 to determine the next available free sector location for the flash driver 306 to store data on the medium 100/200. Process 1400 also enables the sector manager 402 to provide each physical sector address (for the next free sector) for assignment to each logical sector address write request by the file system 305 as described above. Process 1400 includes steps 1402–1418. The order in which the process is described is not intended to be construed as a limitation. Furthermore, the process can be implemented in any suitable hardware, software, firmware, or combination thereof.

In step 1402, the X block counter 1304 and Y sector counter 1306 are initially set to zero. At this point it is assumed that no data resides on the medium 100/200.

In step 1404, the driver 306 receives a write request and the sector manager 402 is queried to send the next available free physical sector address to the logical-to-physical sector mapping module 404. The write request may come from the file system 305 and/or internally from the compactor 406 for recycling sectors as shall be explained in more detail below.

In step 1406, the data is written to the sector indicated by the write pointer 1302. Since both counters are initially set to zero in this exemplary illustration, suppose that the write pointer 1302 points to sector zero, block zero.

In step 1408, the sector counter 1306 is advanced one valid sector. For example, the write pointer advances to sector one of block zero, following the example from step 1406.

Next, in decisional step 1410, the sector manager 402 checks whether the sector counter 1306 exceeds the number of sectors K in a block. If the Y count does not exceed the maximum sector size of the block, then according to the NO branch of decisional step 1410, steps 1404–1410 repeat for the next write request.

On the other hand, if the Y count does exceed the maximum sector size of the block, then the highest physical sector address of the block was written to and the block is full. Then according to the YES branch of step 1410, in step 1412 the Y counter is reset to zero. Next, in step 1414, X block counter 1304 is incremented by one, which advances the write pointer 1302 to the next block at the lowest valid physical sector address, zero, of that block.

Next, in decisional step 1416, the compactor 406 checks whether the X block counter is pointing to a bad block. If it is, X block counter 1304 is incremented by one. In one implementation, the compactor 406 is responsible for checking this condition. As mentioned above, the sector manager stores all of the physical sector addresses that are free to handle a write request. Entire blocks of physical sector addresses are always added by the compactor during a compaction or during initialization. So, the sector manager 402 does not have to check to see if blocks are bad, although the sector manager could be implemented to do so. It should also be noted that in other implementations step 1416 could be performed at the start of process 1400.

In step 1417, the X block counter 1304 is incremented until it is pointing to a good block. To avoid a continuous loop, if all the blocks are bad, then process 1400 stops at step 1416 and provides an indication to a user that all blocks are bad.

Next in decisional step 1418, the sector manager checks whether the X block counter 1304 exceeds the maximum numbers of blocks N. This would indicate that write pointer 1302 has arrived full circle (at the top of circle 1200). If that is the case, then according to the YES branch of step 1418, the process 1400 repeats and the X and Y counter are reset to zero. Otherwise, according to the NO branch of step 1418, the process 1400 returns to step 1404 and proceeds.

In this exemplary process 1400, the write pointer 1302 initially starts with the lowest physical sector address of the lowest addressed block. The write pointer 1302 advances a sector at a time through to the highest physical sector address of the highest addressed block and then back to the lowest, and so forth. This continuous and circular process 1400 ensures that data is written to each sector of the medium 100/200 fairly and evenly. No particular block or sector is written to more than any other, ensuring even wear-levels throughout the medium 100/200. Accordingly, process 1400 permits data to be written to the next available free sector extremely quickly without expensive processing algorithms used to determine where to write new data while maintaining even wear-levels. Such conventional algorithms can slow the write speed of a computer device.

In an alternative implementation, it is possible for the write pointer 1302 to move in a counter clock wise direction starting with highest physical sector address of the highest block address N and decrement its counters. In either case, bad blocks can be entirely skipped and ignored by the sector manager. Additionally, the counters can be set to any value and do not necessarily have to start with the highest or lowest values of for the counters.

Figure 15:
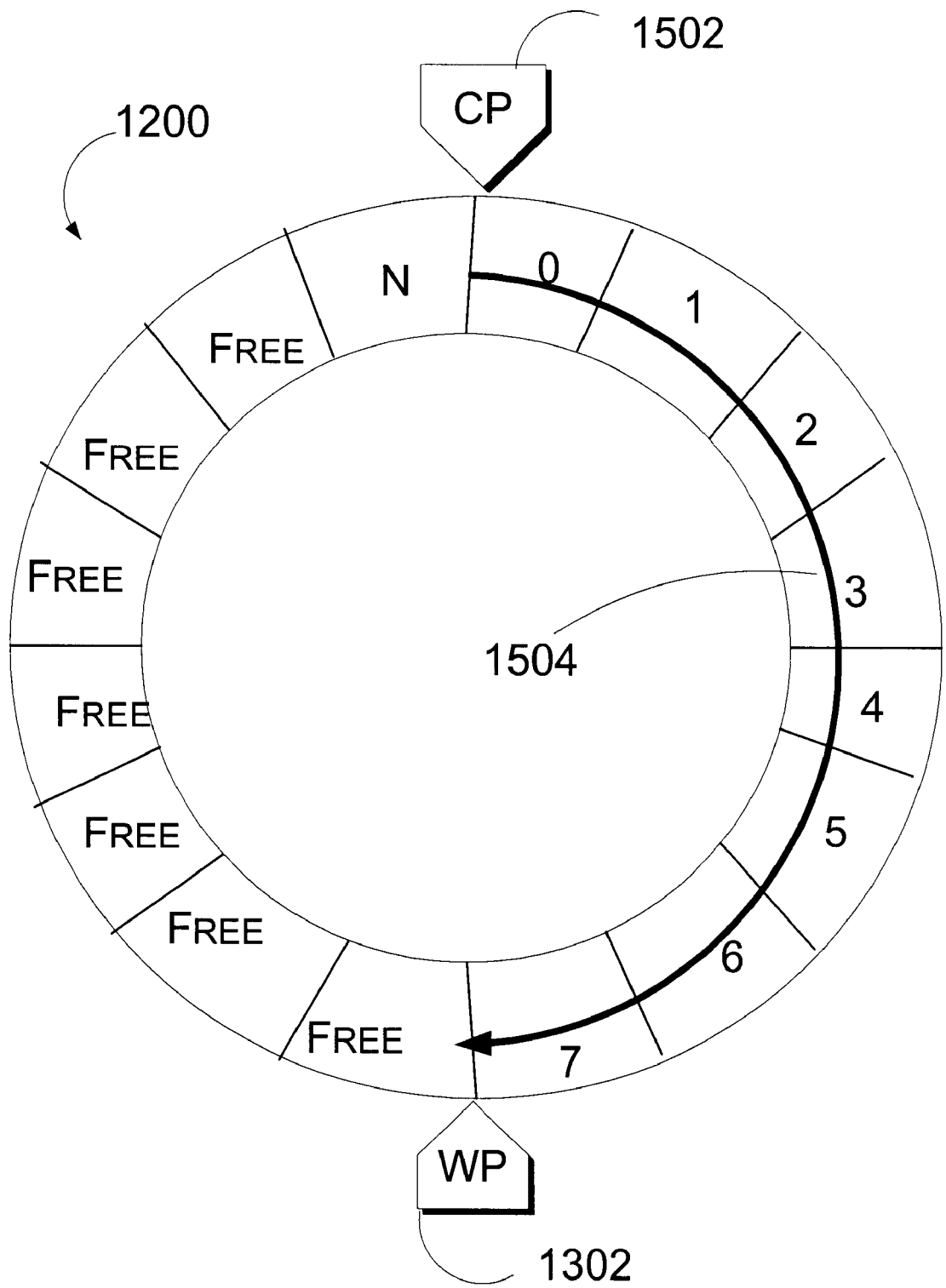
FIG. 15 illustrates another view of media treated as a continuous circle.

FIG. 15 illustrates another view of media 100/200 viewed as a continuous circle 1200. As shown in FIG. 15, the write pointer 1302 has advanced through blocks 0 through 7 and is approximately half way through circle 1200. Accordingly, blocks 0 through 7 contain dirty, valid data, or bad blocks. That is, each good sector in blocks 0 through 7 is not free, and therefore, not available to receive new or modified data. Arrow 1504 represents that blocks 0 through 7 contain used sectors. Eventually, the write pointer 1302 will either run out of free sectors to write to unless sectors that are marked dirty or are not valid are cleared and recycled. To clear a sector means that sectors are reset to a writable state or in other words are "erased." In order to free sectors it is necessary to erase at least a block at a time. Before a block can be erased, however, the contents of all good sectors are copied to the free sectors to a different portion of the media. The sectors are then later marked "dirty" and the block is erased.

The compactor 406 is responsible for monitoring the condition of the medium 100/200 to determine when it is appropriate to erase blocks in order to recycle free sectors back to the sector manager 402. The compactor 406 is also responsible for carrying out the clear operation. To complete the clear operation, the compactor 406, like the sector manager 402, maintains a pointer. In this case, the compactor 406 maintains a clear pointer 1502, which is shown in FIG. 15. The clear pointer 1502 points to physical blocks and as will be explained enables the compactor 406 to keep track of sectors as the medium 100/200 as blocks are cleared. The compactor 406 can maintain a pointer to a block to compact next since an erase operation affects entire blocks. That is, when the compactor 406 is not compacting a block, the compactor 406 points to a block.

Figure 16:
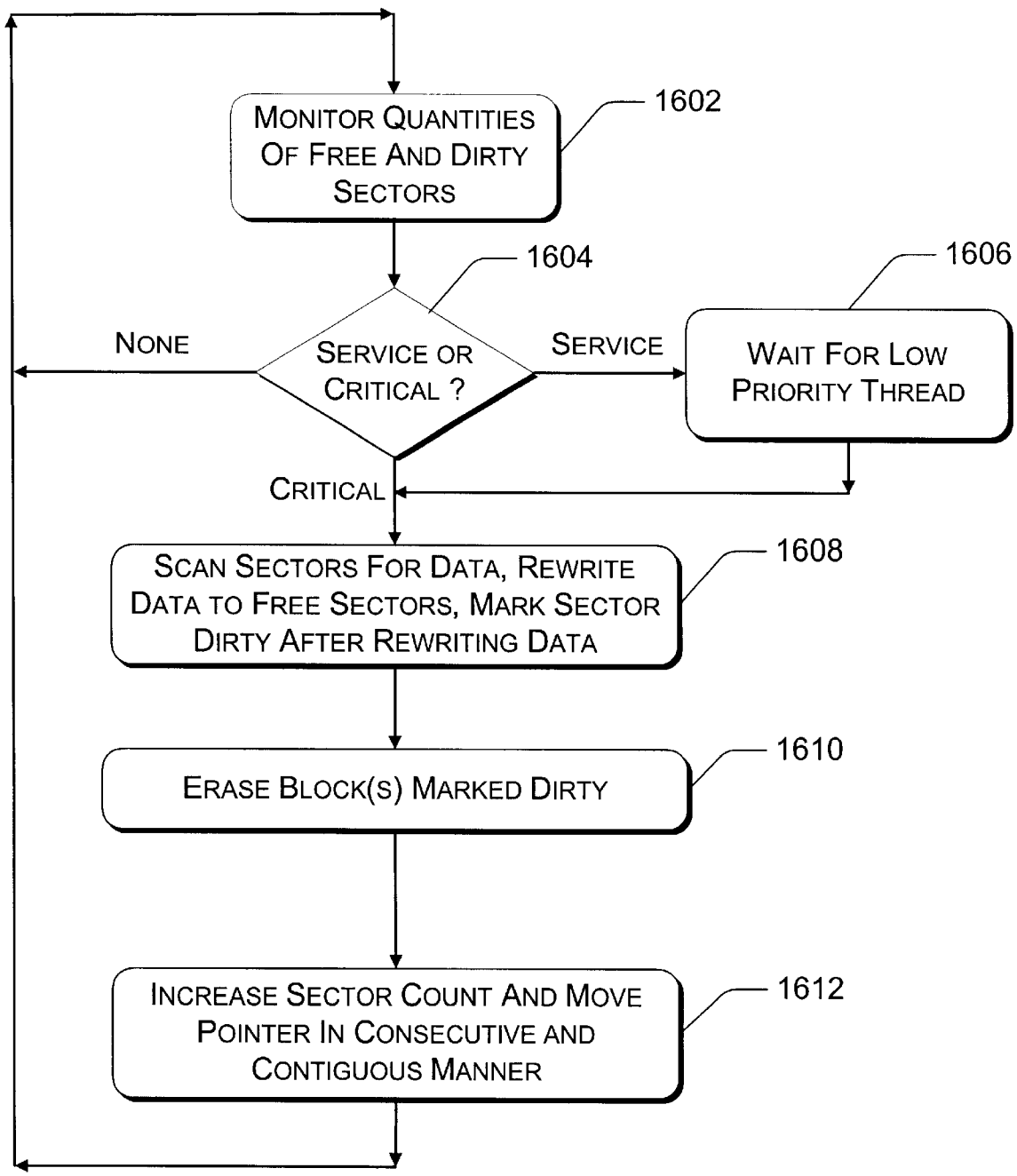
FIG. 16 is a flow chart illustrating a process used by the compactor to recycle sectors.

FIG. 16 is a flow chart illustrating a process 1600 used by the compactor to recycle sectors. Process 1600 includes steps 1602–1612. The order in which the process is described is not intended to be construed as a limitation. Furthermore, the process can be implemented in any suitable hardware, software, firmware, or combination thereof. In step 1602, the compactor 406 monitors how frequently the flash memory medium 100/200 is written to or updated by the file system. This is accomplished by specifically monitoring the quantities of free and dirty sectors on the medium 100/200. The number of free sectors and dirty sectors can be determined counting free and dirty sectors stored in tables 600 and/or 900 described above.

In decisional step 1604, the compactor 406 performs two comparisons to determine whether it is prudent to recycle sectors. The first comparison involves comparing the amount of free sectors to dirty sectors. If the amount of dirty sectors outnumbers the free sectors, then the compactor 406 deems it warranted to perform a recycling operation, which in this case is referred to as a "service compaction." Thus a service compaction is indicated when the number of dirty sectors outnumbers the quantity of free sectors.

If a service compaction is deemed warranted, then in step 1606 the compactor waits for a low priority thread 1606, before seizing control of the medium to carry out steps 1608–1612 to clear blocks of dirty data. The service compaction could also be implemented to occur at other convenient times when it is optional to recycle dirty sectors into free sectors. For instance, in an alternative implementation, when one third of the total sectors are dirty, the flash abstraction logic 308 can perform a service compaction. In either implementation, usually the compactor 406 waits for higher priority threads to relinquish control of the processor 302 and/or flash medium 100/200. Once a low priority thread is available, the process proceeds to step 1608.

Referring back to step 1604, the second comparison involves comparing the amount of free sectors left on the medium, to determine if the write pointer 1302 is about to or has run out of free sectors to point to. If this is the situation, then the compactor 406 deems it warranted to order a "critical compaction" to recycle sectors. The compactor does not wait for a low priority thread and launches immediately into step 1608.

In step 1608, the compactor 406 operates at either a high priority thread or low priority thread depending on step 1604. If operating at a high level thread (critical compaction), the compactor 1102 is limited to recycling a small number, e.g., 16 dirty sectors, into free sectors and return control of the processor back to computer device 300 to avoid monopolizing the processor 302 during such an interruption.

Thirty two sectors per block is commonly manufactured for flash media, but other numbers of sectors, larger or smaller, could be selected for a critical compaction. Regardless of these size characteristics, the number of sectors recycled during a critical compaction is arbitrary but must be at least 1 (in order to satisfy the current WRITE request). A critical compaction stalls the file system 305 from being able to complete a write; therefore, it is important to complete the compaction as soon as possible. In the case of a critical compaction, the compactor 406 must recycle at least one dirty sector into a free sector so that there is space on the medium to fulfill the pending write request. Having more than one sector recycled at a time, such as 16, avoids the situation where there are multiple pending write requests and multiple critical compactions that are performed back-to-back, effectively blocking control of the processor indefinitely. So, while the number of sectors recycled chosen for a critical compaction can vary, a number sufficient to prevent back-to-back critical compactions is implemented in the exemplary description.

So, in step 1608, the compactor 406 will use the clear pointer 1502 to scan sectors for valid data, rewrite the data to free sectors, and mark a sector dirty after successfully moving data. Accordingly, when moving data, the compactor uses the same processes described with reference to process 700, which is the same code that is used when the file system 305 writes new and/or updates data. The compactor 406 queries the sector manager 402 for free sectors when moving data, in the same fashion as described with reference to process 1400.

In step 1610, the compactor 406 moves the clear pointer 1502 sector-by-sector using a sector counter like the write counter 1306 shown in FIG. 13, except this sector counter pertains to the location of the clear pointer 1502. The compactor 406 also keeps track of blocks through a counter in similar fashion as described with reference to the write pointer 1302. However, the amount of blocks cleared is determined by the number of dirty sectors with the exception of a critical compaction. In a critical compaction, the compactor only compacts enough blocks to recycle a small number of physical sectors (i.e. 16 sectors).

Figure 17:
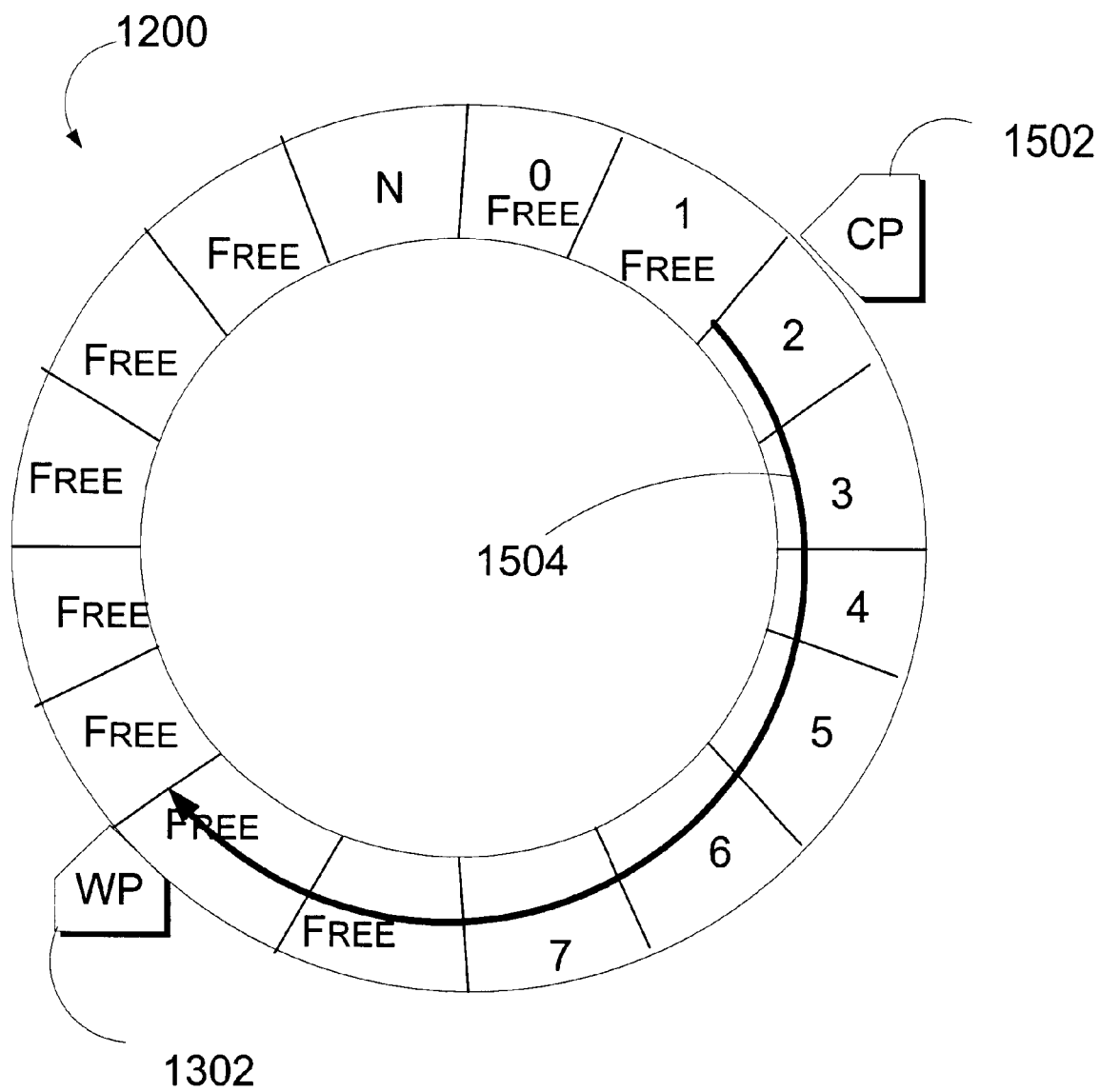
FIG. 17 shows one exemplary result from the process illustrated in FIG. 16.

In step 1612, the compactor erases (clears) those blocks which contain good sectors that are fully marked dirty. FIG. 17 shows exemplary results from process 1600. In this example, blocks 0 and 1 were cleared and the clear pointer was moved to the first sector of block 2, in the event another compaction is deemed warranted. As a result, the compactor 406 recycled two blocks worth of the sectors from blocks 0 and 1, which provides more free sectors to the sector manager 402. Used sectors 1504 forms a data stream (hereinafter a "data stream" 1504) that rotates in this implementation in a clockwise fashion. The write pointer 1302 remains at the head of the data stream 1504 and the clear pointer 1502 remains at the end or "tail" of the data stream 1504. The data stream 1504 may shrink as data is deleted, or grow as new data is added, but the pointers always point to opposite ends of the data stream 1504: head and tail.

Treating the flash memory medium as if the physical sector addresses form a continuous circle 1200, and using the processes described above, enables the flash abstraction logic 308 to accomplish uniform wear-leveling throughout the medium 100/200. The compactor 406 selects a given block the same number times for recycling of sectors through erasure. Since flash blocks have a limited write/erase cycle, the compactor as well as the sector manager distributes these operations across blocks 0–N as evenly and as fairly as possible. In this regard, the data steam 1504 rotates in the circle 1200 (i.e. the medium 100/200) evenly providing perfect wear-levels on the flash memory medium 100/200.

In the event of power failure, the flash abstraction logic 310 contains simple coded logic that scans the flash memory medium 100/200 and determines what locations are marked free and dirty. The logic is then able to deduce that the data stream 1504 resides between the locations marked free and dirty, e.g. . . . , the data stream 1106 portion of the circle 1200 described in FIG. 17. The head and tail of the data stream 1504 is easily determined by locating the highest of the physical sector addresses containing data for the head and by locating the lowest of the physical sector addresses containing data for the tail.

NOR Flash Devices

Although all the aforementioned sections in this Detailed Description section apply to NAND and NOR flash devices, if a NOR flash memory medium 200 is used, some additional implementation is needed for the flash medium logic to support the storing of data in each physical sector on the medium 200. Each NOR block 0, 1, 2, etc. can be treated like a NAND flash memory medium 100, by the flash medium logic 310. Specifically, each NOR block is subdivided into some number of pages where each page consists of a 512 byte "data area" for sector data and an 8 byte "spare area" for storing things like to the logical sector address, status bits, etc. (as described above).

Figure 18:
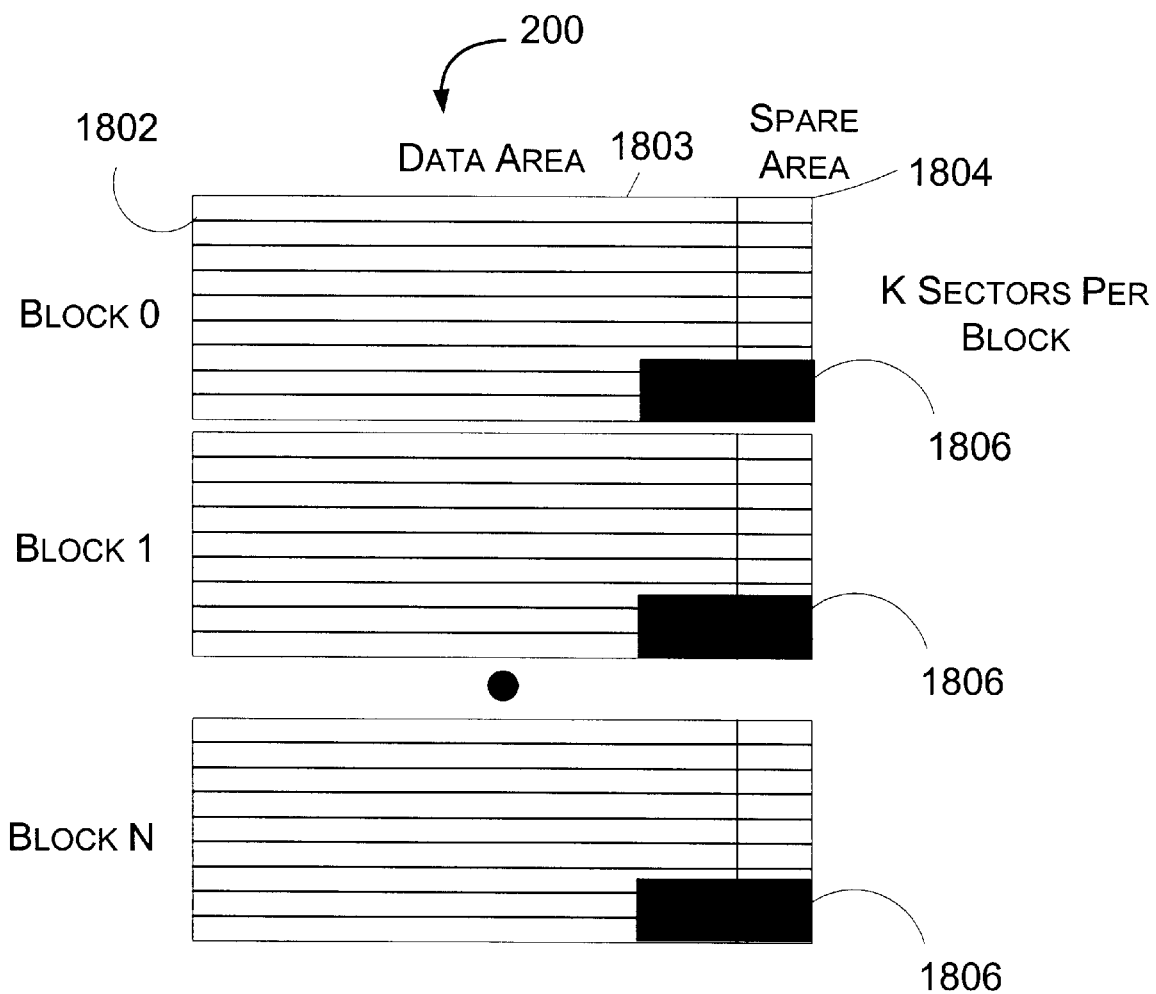
FIG. 18 illustrates a logical representation of a NOR flash memory medium divided in way to better support the processes and techniques implemented by the flash driver.

FIG. 18 illustrates a logical representation of a NOR flash memory medium 200 divided in way to better support the processes and techniques implemented by the flash driver. In this implementation, sectors 1802 contain a 512 byte data area 1803 for the storage of sector related data and 8 bytes for a spare area 1804. Sections 1806 represent unused portions of NOR blocks, because a NOR Flash block is usually a power of 2 in size, which is not evenly divisible.

For instance, consider a 16 MB NOR flash memory device that has 128 flash blocks each 128 KB in size. Using a page size equal to 520 bytes, each NOR flash block can be divided into 252 distinct sectors with 32 bytes remaining unused. Unfortunately, these 32 bytes per block are "wasted" by the flash medium logic 310 in the exemplary implementation and are not used to store sector data. The tradeoff, however, is the enhanced write throughput, uniform wear leveling, data loss minimization, etc. all provided by the flash abstraction logic 308 of the exemplary flash driver 306 as described above. Alternative implementations could be accomplished by dividing the medium 200 into different sector sizes.

Computer Readable Media

An implementation of exemplary subject matter using a flash driver as described above may be stored on or transmitted across some form of computer-readable media. Computer-readable media can be any available media that can be accessed by a computer. By way of example, and not limitation, computer readable media may comprise "computer storage media" and "communications media."

"Computer storage media" include volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media.

The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

Conclusion

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. A method for managing erasures on a flash memory device having addressable physical sectors organized as blocks, comprising:

tracking how many physical sectors are free to receive data;

tracking how many physical sectors contain data that is dirty;

comparing whether the physical sectors that are free to receive data outnumber the physical sectors that contain data that is dirty; and executing an erase operation of one or more blocks when the physical sectors that contain data that is dirty outnumber the physical sectors that are free to receive data.

2. The method as recited in claim 1, further comprising: scheduling the execution of the erase operation as a low priority thread.

3. The method as recited in claim 1, further comprising:
tracking when the physical sectors that are free to receive data are insufficient in quantity to receive write requests from a file system; and
executing a second erase operation of one or more blocks if the physical sectors that are free to receive data are insufficient in quantity.

4. The method as recited in claim 3, further comprising scheduling the execution of the second erase operation as high priority thread.

5. One or more computer-readable media comprising computer executable instructions that, when executed, perform the method as recited in claim 1.

6. A method for managing erasures on a flash memory device having addressable physical sectors organized as blocks, comprising:
tracking how many physical sectors are free to receive data;
tracking when the physical sectors that are free to receive data are insufficient in quantity to receive write requests from a file system; and
executing an erase operation of one or more blocks if the physical sectors that are free to receive data are insufficient in quantity.

7. The method as recited in claim 6, further comprising scheduling the execution of the erase operation as high priority thread.

8. The method as recited in claim 6, further comprising:
tracking how many physical sectors contain data that is dirty;
comparing whether the physical sectors that are free to receive data outnumber the physical sectors that contain data that is dirty; and
executing a second erase operation of one or more blocks when the physical sectors that contain data that is dirty outnumber the physical sectors that are free to receive data.

9. The method as recited in claim 8, further comprising: scheduling the execution of the second erase operation as a low priority thread.

10. One or more computer-readable media comprising computer executable instructions that, when executed, perform the method as recited in claim 6.

11. A system for flash memory having addressable locations organized as blocks, comprising:
flash abstraction logic, configured to track how many physical sectors are free to receive data; track how many physical sectors contain data that is dirty, and compare whether the physical sectors that are free to receive data outnumber the physical sectors that contain data that is dirty; and
a compactor, configured to perform an erase operation of one or more blocks when the physical sectors that contain data that is dirty outnumber the physical sectors that are free to receive data.

12. The system as recited in claim 11, wherein when the compactor performs an erase operation, the compactor advances through a sequence of the physical sector addresses and if a particular physical sector address corresponding to a physical sector in the memory contains valid data, the compactor moves the valid data to a physical sector address corresponding to a physical sector in the memory that is free to receive data before performing the erase operation.

13. The system as recited in claim 11, wherein the compactor performs the erase operation as low priority thread.

14. The system as recited in claim 11, wherein the flash abstraction logic is further configured to track how many physical sector addresses are free to receive data,
track when the physical sector addresses that are free to receive data are insufficient in quantity to receive write requests from a file system; and
the compactor is further configured to execute an erase operation of one or more blocks if the physical sector addresses that are free to receive data are insufficient in quantity.

15. A system for flash memory having addressable locations organized as blocks, comprising:
flash abstraction logic configured to track how many physical sector addresses are free to receive data, and track when the physical sector addresses that are free to receive data are insufficient in quantity to receive write requests from a file system; and
a compactor, configured to execute an erase operation of one or more blocks if the physical sector addresses that are free to receive data are insufficient in quantity.

16. The system as recited in claim 15, wherein when the compactor performs an erase operation, the compactor advances through a sequence of the physical sector addresses and if a particular physical sector address corresponding to a physical sector in the memory contains valid data, the compactor moves the valid data to a physical sector address corresponding to a physical sector in the memory that is free to receive data before performing the erase operation.

17. The system as recited in claim 15, wherein the flash abstraction logic is further configured to track how many physical sectors are free to receive data; track how many physical sectors contain data that is dirty, and compare whether the physical sectors that are free to receive data outnumber the physical sectors that contain data that is dirty; and
the compactor, is further configured to perform an erase operation of one or more blocks when the physical sectors that contain data that is dirty outnumber the physical sectors that are free to receive data.

18. The system as recited in claim 15, wherein the compactor performs the erase operation as a high priority thread.

19. One or more computer-readable media comprising computer-executable instructions that, when executed by a computer, causes the computer to:
organize a flash memory having addressable locations into blocks;
track how many physical sectors are free to receive data;
track how many physical sectors contain data that is dirty;
compare whether the physical sectors that are free to receive data outnumber the physical sectors that contain data that is dirty; and
perform an erase operation of one or more blocks when the physical sectors that contain data that is dirty outnumber the physical sectors that are free to receive data.

20. One or more computer-readable media as recited in claim 19, that causes the computer when performing the erase operation to:
- advance through a sequence of the physical sector addresses; and
- if a particular physical sector address corresponding to a physical sector in the memory contains valid data, to move the valid data to a physical sector address corresponding to a physical sector in the memory that is free to receive data before performing the erase operation.

21. One or more computer-readable media as recited in claim 19, wherein the computer treats the erase operation as low priority thread.

22. One or more computer-readable media as recited in claim 19, that causes the computer to: further track how many physical sector addresses are free to receive data, track when the physical sector addresses that are free to receive data are insufficient in quantity to receive write requests from a file system; and perform an erase operation of one or more blocks if the physical sector addresses that are free to receive data are insufficient in quantity.

23. One or more computer-readable media comprising computer-executable instructions that, when executed by a computer, causes the computer to:
- organize a flash memory having addressable locations into blocks;
- track how many physical sector addresses are free to receive data;
- track when the physical sector addresses that are free to receive data are insufficient in quantity to receive write requests from a file system; and
- execute an erase operation of one or more blocks if the physical sector addresses that are free to receive data are insufficient in quantity.

24. One or more computer-readable media as recited in claim 23, that causes the computer when performing the erase operation to:
- advance through a sequence of the physical sector addresses; and
- if a particular physical sector address corresponding to a physical sector in the memory contains valid data, to move the valid data to a physical sector address corresponding to a physical sector in the memory that is free to receive data before performing the erase operation.

25. One or more computer-readable media as recited in claim 23, that causes the computer to further track how many physical sectors are free to receive data; track how many physical sectors contain data that is dirty, and compare whether the physical sectors that are free to receive data outnumber the physical sectors that contain data that is dirty; and perform an erase operation of one or more blocks when the physical sectors that contain data that is dirty outnumber the physical sectors that are free to receive data.

26. One or more computer-readable media as recited in claim 23, wherein the computer treats the erase operation as a high priority thread.

* * * * *